United States Patent
Jin et al.

(10) Patent No.: US 8,506,832 B2
(45) Date of Patent: Aug. 13, 2013

(54) WAFER DIVIDING APPARATUS AND METHODS

(75) Inventors: Hotae Jin, Cheonan-si (KR); Seonju Oh, Cheonan-si (KR); HeuiSeog Kim, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 376 days.

(21) Appl. No.: 12/805,641

(22) Filed: Aug. 11, 2010

(65) Prior Publication Data

US 2011/0053376 A1 Mar. 3, 2011

(30) Foreign Application Priority Data

Aug. 25, 2009 (KR) .................. 10-2009-0078908

(51) Int. Cl.
*H01L 21/302* (2006.01)
(52) U.S. Cl.
USPC ........... 216/53; 216/36; 216/92; 216/99; 438/458; 438/690; 438/691; 438/692; 125/16.01
(58) Field of Classification Search
None
See application file for complete search history.

(56) References Cited

U.S. PATENT DOCUMENTS

| | | | | |
|---|---|---|---|---|
| 3,901,423 A | * | 8/1975 | Hillberry et al. | 225/2 |
| 4,967,725 A | * | 11/1990 | Hinzen | 125/21 |
| 5,351,446 A | * | 10/1994 | Langsdorf | 451/28 |
| 5,653,803 A | * | 8/1997 | Ito | 438/404 |
| 5,882,539 A | * | 3/1999 | Hasegawa et al. | 216/88 |
| 6,319,103 B1 | * | 11/2001 | Kim | 451/173 |
| 6,382,292 B1 | * | 5/2002 | Ohmi et al. | 156/756 |
| 6,554,046 B1 | * | 4/2003 | Bryan et al. | 156/757 |
| 8,206,548 B2 | * | 6/2012 | Kajino et al. | 156/345.18 |
| 8,328,942 B2 | * | 12/2012 | Mooring et al. | 118/724 |
| 2010/0037880 A1 | * | 2/2010 | Kawasaki et al. | 125/16.02 |
| 2010/0089377 A1 | * | 4/2010 | Oishi et al. | 125/16.02 |
| 2010/0219500 A1 | * | 9/2010 | Morita et al. | 257/506 |
| 2011/0130294 A1 | * | 6/2011 | Saito et al. | 505/401 |
| 2012/0048906 A1 | * | 3/2012 | Rayssac et al. | 225/2 |
| 2012/0255535 A1 | * | 10/2012 | Tagami et al. | 125/21 |

FOREIGN PATENT DOCUMENTS

| | | |
|---|---|---|
| JP | 07-245279 A | 9/1995 |
| JP | 10-326759 A | 12/1998 |
| JP | 11-340443 A | 12/1999 |
| JP | 2008-213110 A | 9/2008 |

* cited by examiner

*Primary Examiner* — Anita Alanko
(74) *Attorney, Agent, or Firm* — Harness, Dickey & Pierce, P.L.C.

(57) ABSTRACT

Example embodiments are directed to a wafer dividing apparatus and method thereof. The wafer dividing apparatus includes a chuck unit having upper and lower chucks, a cutting wire that is provided in a space between the upper and lower chucks to cut a wafer and driven by a first driving unit, and an etchant supplying nozzle supplying etchant to a groove of the wafer, which is formed by the cutting wire.

16 Claims, 7 Drawing Sheets

WAFER DIVIDING APPARATUS AND METHODS

CROSS-REFERENCE TO RELATED APPLICATIONS

This U.S. non-provisional patent application claims priority under 35 U.S.C. §119 to Korean Patent Application No. 10-2009-0078908, filed on Aug. 25, 2009, the entire contents of which are hereby incorporated by reference.

BACKGROUND

Example embodiments relate to dividing a wafer, and more particularly, to a wafer dividing apparatus and method.

Electronic appliances are designed for high performance, thereby resulting in higher operational speed of semiconductor devices contained therein. In addition, as the electronic appliances reduce in size, semiconductor device packages are also becoming smaller in size, slimmer and light in weight.

A semiconductor assembly process includes, among other steps, dividing semiconductor integrated circuits formed in a wafer process, electrically connecting the semiconductor integrated circuits so that the semiconductor integrated circuits can be used as electronic components, sealing and packaging the semiconductor integrated circuits to protect them from external impact. A large number of identical semiconductor integrated circuits having identical electric circuits are formed on a single wafer.

One of the primary processes of the semiconductor assembly process is a back-grinding process. The wafer having a relatively large diameter is manufactured relatively thick to minimize damage thereto during a manufacturing process. In a back-grinding process, the thickness of the wafer may be reduced by grinding a back surface of the wafer.

SUMMARY

According to example embodiments of the inventive concepts, a wafer dividing apparatus includes a chuck unit including upper and lower chucks; a cutting wire in a space between the upper and lower chucks, the cutting wire configured to cut a wafer and being driven by a first driving unit; and an etchant supplying nozzle configured to supply etchant to a groove of the wafer, the groove being formed by the cutting wire.

According to example embodiments of the inventive concepts, the upper and lower chucks respectively include first and second recess regions that face each other and are configured to load the wafer.

According to example embodiments of the inventive concepts, the wafer dividing apparatus further includes a deionized water supplying nozzle configured to supply deionized water to a portion of the wafer adjoining a portion to which the etchant is supplied.

According to example embodiments of the inventive concepts, the upper and lower chucks further include respective protective members on edges portions of chuck surfaces, the respective protective members facing each other and protruding from the respective first and second recess regions.

According to example embodiments of the inventive concepts, the protective members are formed of a material selected from the group consisting of ultra hard metal alloy, DLC (diamond-like carbon), diamond, and ceramic, and a combination thereof.

According to example embodiments of the inventive concepts, the chuck unit is formed of porous ceramic.

According to example embodiments of the inventive concepts, the wafer dividing apparatus further includes a cutting table under the lower chuck, the cutting table being driven by a second driving unit configured to rotate the lower chuck.

According to example embodiments of the inventive concepts, the wafer dividing apparatus further includes a third driving unit configured to rotate the upper chuck.

According to example embodiments of the inventive concepts, the upper and lower chucks are connected to respective vacuum pipes providing vacuum.

According to example embodiments of the inventive concepts, the wafer dividing apparatus further includes first and second attaching members on the respective first and second recess regions, the first and second attaching members configured to fix the wafer in the first and second recess regions.

According to example embodiments of the inventive concepts, the first and second attaching members are formed of adhesive films, resin, or rubber.

According to example embodiments of the inventive concepts, a wafer dividing method includes providing a chuck unit having upper and lower chucks; loading a wafer between the lower and upper chucks; cutting a wafer from an edge thereof by inserting a cutting wire in a space between the lower and upper chucks; and supplying etchant to a gap of the wafer, the gap being formed by the cutting wire.

According to example embodiments of the inventive concepts, the wafer dividing method further includes providing a chuck unit, wherein a space between the lower and upper chucks is greater than a diameter of the cutting wire by approximately 10-20 µm.

According to example embodiments of the inventive concepts, the wafer dividing method further includes removing pollutants generated by the cutting wire by injecting nitrogen.

According to example embodiments of the inventive concepts, the wafer dividing method further includes supplying the etchant while maintaining the wafer at a temperature of approximately 50-100° C.

According to example embodiments of the inventive concepts, the wafer dividing method further includes supplying deionized water to a portion of the wafer to which the etchant is supplied.

According to example embodiments of the inventive concepts, the wafer dividing method further includes driving the cutting wire by a driving unit, the driving unit configured to vary a driving direction of the cutting wire.

According to example embodiments of the inventive concepts, the wafer dividing method further includes cutting the wafer while reciprocating the cutting wire.

According to example embodiments of the inventive concepts, cutting the wafer includes at least one of supplying a slurry containing grinding powder and cutting oil to the cutting wire, and using a cutting wire to which a grinding material is attached.

According to example embodiments of the inventive concepts, the cutting wire is under a tension of about 10-50 N while dividing the wafer.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIGS. 1 to 7 illustrate a wafer dividing apparatus and method according to example embodiments of inventive concepts.

Figure 3:
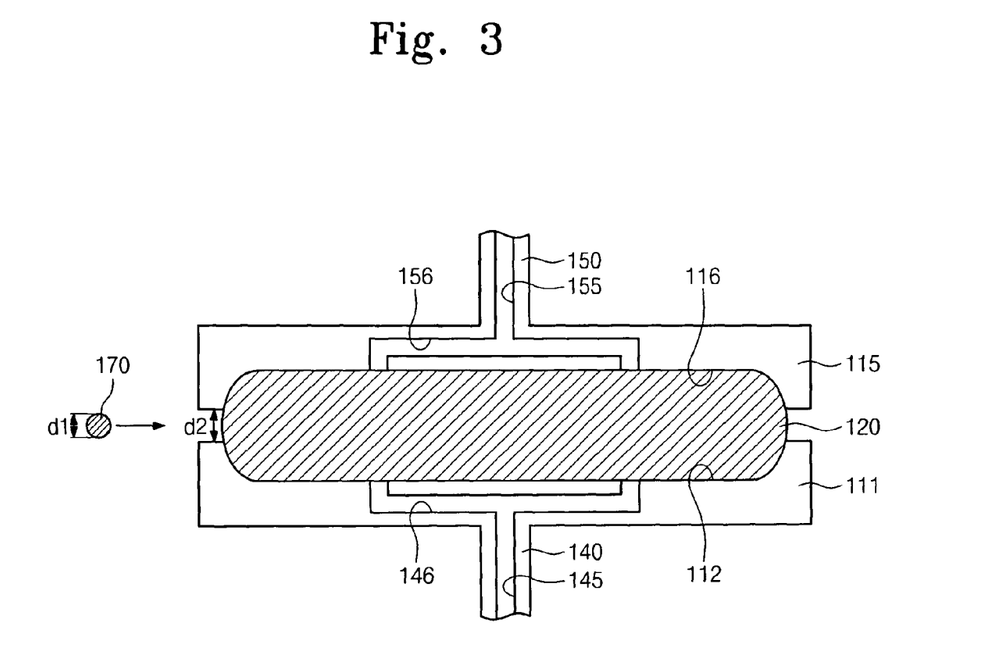
FIG. 3 is a cross-sectional view taken along line A-A' of FIG. 2, according to example embodiments of inventive concepts.
Figure 4:
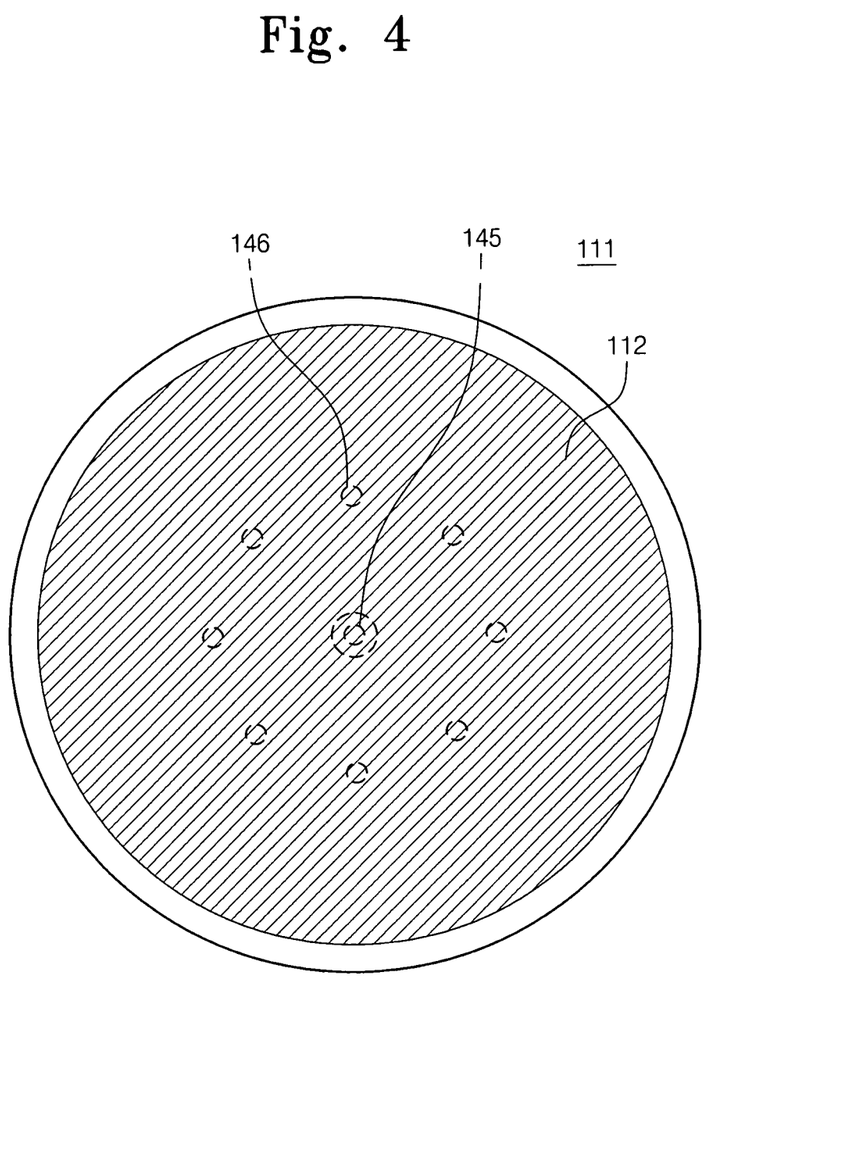
FIG. 4 is a top-plane view illustrating a top surface of a lower chuck of FIG. 3.

Referring to FIGS. 1 to 4, a chuck unit 110 is on a cutting table 130. The chuck unit 110 includes a lower chuck 111 and an upper chuck 115. A cutting wire 170 driven by a first driving unit is provided between the upper and lower chucks 115 and 111. A wafer 120 is loaded on the lower chuck 111 (D1). The chuck unit 110 may be formed of a porous ceramic. The lower chuck 111, as shown in FIGS. 3 and 4, includes a first recess region 112 for loading the wafer 120. The first recess region 112 may correspond to a lower portion of the wafer 120. The cutting table 130 is rotatably connected to a second driving unit through a first rotational shaft 140. A first vacuum pipe 145 extends from the first rotational shaft 140 and into the cutting table 130 and the lower chuck 111. The first vacuum pipe 145 is connected to a vacuum pump (not shown) to provide adhesive force between the wafer 120 and the first recess region 112. The lower chuck 111 includes a second vacuum pipe 146 that is connected to the first vacuum pipe 145 to transfer vacuum to the first recess region 112.

The upper chuck 115 is provided on the wafer 120 (D2). The upper and lower chucks 115 and 111 are disposed to face each other. As shown in FIGS. 3 and 4, the upper chuck 115 includes a second recess region 116 for loading the wafer 120. The second recess region 116 is formed to correspond to an upper portion of the wafer 120. The second recess region 116 faces the first recess region 112. The upper chuck 115 is rotatably connected to a third driving unit through a second rotational shaft 150. The third driving unit is synchronized with the second driving unit to rotate the wafer 120 at a near identical speed. For example, a rotational direction of the wafer 120 may vary during a desired period. A third vacuum pipe 155 extends from the second rotational shaft 150. The third vacuum pipe 155 is connected to a vacuum pump (not shown) to provide adhesive force between the wafer 120 and the second recess region 116. The upper chuck 115 includes a fourth vacuum pipe 156 that is connected to the third vacuum pipe 155 to transfer vacuum to the second recess region 116.

When the wafer is loaded in the chuck unit 110, the lower chuck 111 is spaced apart from the upper chuck 115 by a desired distance d2. The wafer may be divided by a cutting wire 170 (D3). The distance d2 may be greater than a diameter d1 of the cutting wire 170. For example, the distance d2 may be greater than the diameter d1 by about 10-20 μm. Accordingly, the cutting wire 170 can move through a space between the lower and upper chucks 111 and 115. A gap between the upper and lower chucks 111 and 115 may guide the movement of the cutting wire 170. Accordingly, the cutting wire 170 may divide the wafer 120 to a uniform thickness along a straight line.

The cutting wire 170 is guided by a guide roller 175. The cutting wire 170 is connected to and driven by the first driving unit. The guide roller 175 and the first driving unit may maintain a desired tension on the cutting wire 170. For example, the tension on the cutting wire 170 may be about 10-50 N. The driving direction of the cutting wire 170 may be varied by the first driving unit. For example, the driving direction of the cutting wire 170 may vary/change after a desired time period. In addition, the cutting wire 170 may reciprocate repeatedly at regular or irregular intervals. A driving speed of the cutting wire 170 may be determined in relation to a rotational speed of the wafer 120. For example, the driving speed of the cutting wire 170 may be about 10 m/s. The cutting wire 170 may be formed of, for example, high carbon steel and have a diameter of 80-200 µm. Soft metal alloy such as Cu or Ni alloy may be coated on the surface of the cutting wire 170. A thickness of the coating layer may be less than about 1 µm. Slurry is supplied through a first nozzle 181. The slurry may contain grinding powder and cutting oil. The grinding powder may include hard grinding particles, such as SiC particles, diamond particles, and the like, of about 5-10 µm. Alternatively, the grinding powder may be adhered to the surface of the cutting wire 170, and the cutting process may not use the slurry. In order to divide the wafer 120, at least one of the cutting wire 170 and the chuck unit 110 moves relative to each other.

Referring to FIGS. 1 to 7, an etchant is introduced on the wafer 120 (D4) and the wafer 120 is cleaned by deionized water (D5). The introduction of the etchant and the cleaning of the wafer 120 can be simultaneously performed during the dividing of the wafer 120 by the cutting wire 170. Second, third, and fourth nozzles 182, 183, and 184 may be provided to introduce the etchant and clean the wafer 120. For the simplicity and brevity, the chuck unit 110 is not shown in FIG. 7. The second nozzle 182 is connected to a nitrogen injection unit to remove pollutants generated by the cutting wire 170. The third nozzle 183 is connected to an etchant supplying unit to assist the dividing of the wafer 120. The third nozzle 183 is designed to introduce the etchant on a groove 125 formed by the cutting wire 170. The etchant may be formed by mixing ammonium hydrogen fluoride, ammonium nitrate, and sulfuric acid, and/or deionized water in a desired ratio. In order to improve etching efficiency, the wafer 120 may be maintained at a temperature of about 50-100° C.

Figure 7:
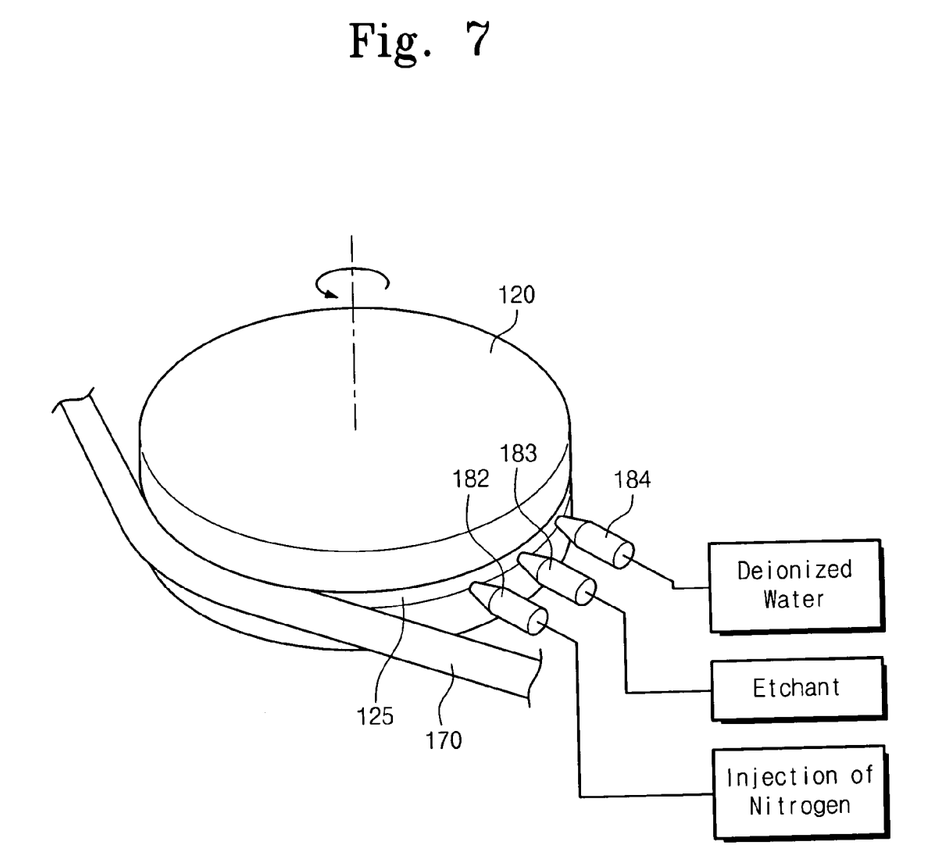
FIG. 7 is a schematic view illustrating a method for combining physical and chemical wafer dividing methods according to example embodiments of inventive concepts.

The fourth nozzle 184 is connected to a deionized water supplying unit and removes a residue of the etchant introduced by the third nozzle 183. The fourth nozzle 184 is disposed adjoining the third nozzle 183 to prevent the wafer 120 from being excessively etched by the etchant.

Figure 1:
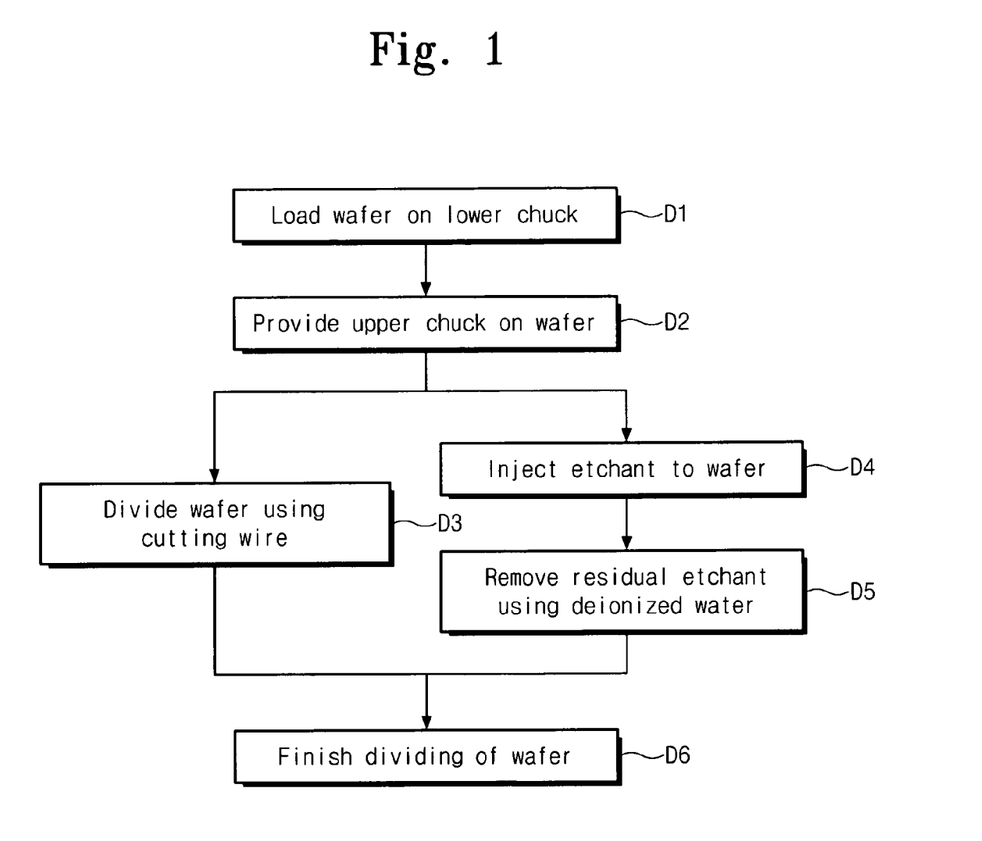
FIG. 1 is a flowchart illustrating a wafer dividing method according to example embodiments of inventive concepts.
Figure 2:
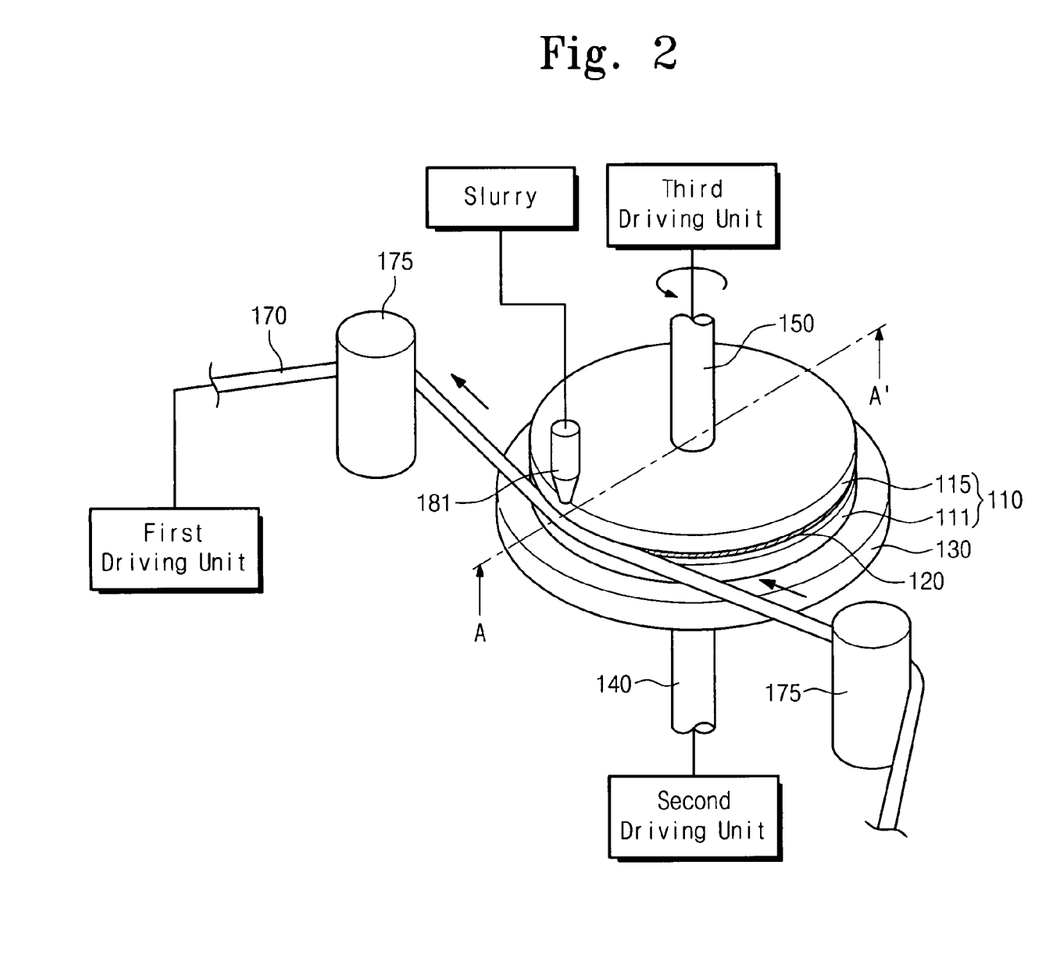
FIG. 2 is a schematic view illustrating a wafer dividing apparatus according to example embodiments of inventive concepts.

Referring to FIG. 1, the dividing of the wafer 120 is finished (D6), after which the process for grinding the divided wafer may be performed. In the conventional back-grinding process, a large part of the wafer is wasted and thus the production cost may increase. In addition, since the back-grinding process is performed for a long time by a chemical material, productivity and environmental issue may be of concern. The wafer dividing method according to example embodiments of the inventive concepts is configured to recycle the divided wafer, thereby reducing the production cost. In addition, by combining the physical and chemical dividing methods, the wafer 120 can be divided in a relative short time.

The following will describe a wafer dividing apparatus and method according to example embodiments of the inventive concepts. The example embodiments are somewhat similar to the preceding example embodiments, except for a structure of the chuck unit. Therefore, an explanation of portions identical to the preceding example embodiments will be omitted for the sake of brevity.

Figure 5:
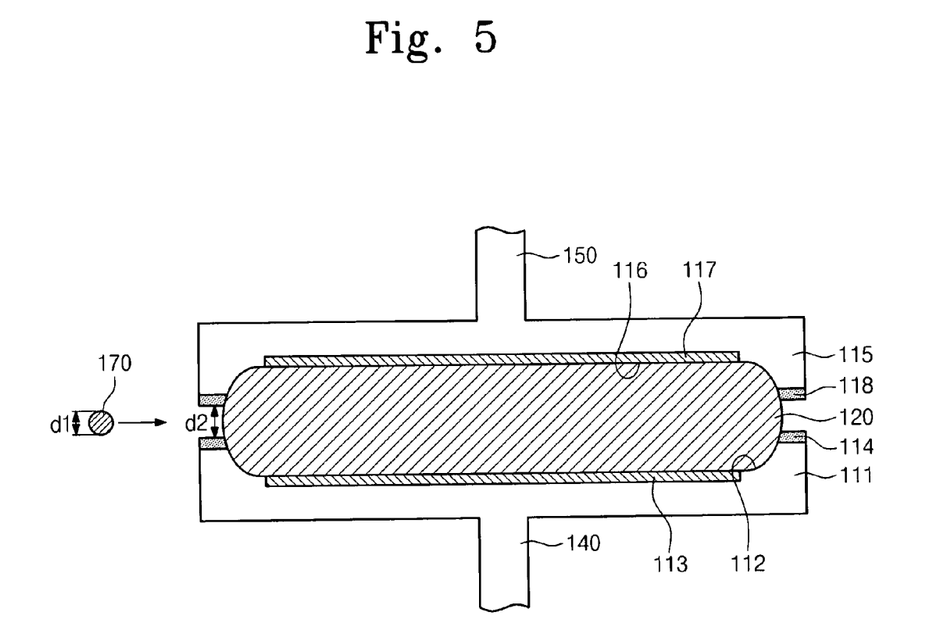
FIG. 5 is a cross-sectional view taken along line A-A' of FIG. 2, according to example embodiments of inventive concepts.
Figure 6:
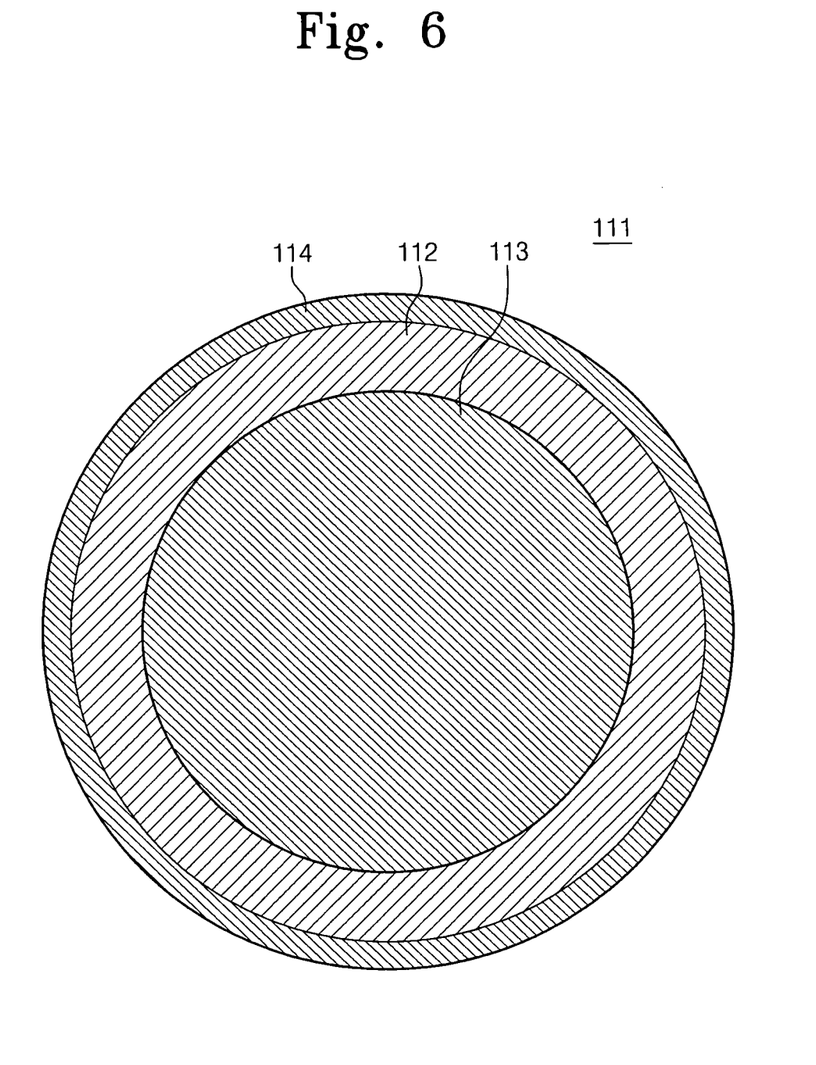
FIG. 6 is a top-plane view illustrating a top surface of a lower chuck of FIG. 5.

Referring to FIGS. 5 and 6, a chuck unit 110 having upper and lower chucks 115 and 111 is provided on a cutting table 130. The lower chuck 111 includes a first protective member 114 on an edge portion of a first recess region 112 and facing the upper chuck 115. The upper chuck 115 includes a second protective member 118 on an edge portion of a second recess region 116 and facing the lower chuck 111. The first and second protective members 114 and 118 prevent the chuck unit 110 from being worn when the cutting wire 170 moves. The first and second protective members 114 and 118 may be formed of a material selected from the group consisting of DLC (diamond-like carbon), diamond, ceramic, and/or a combination thereof, which are superior in wear resistance. The first and second protective members 114 and 118 are detachably provided and thus they can be replaced when they are worn.

A first attaching member 113 may be provided in the first recess region 112. The first attaching member 113 may attach the wafer 120 to the lower chuck 111. Alternatively, the first attaching member 113 may provide frictional force between the wafer 120 and the lower chuck 111. That is, the wafer 120 and the lower chuck 11 rotate together as a result of the first attaching member 113. The first attaching member 113 may be formed of adhesive film, resin, and/or rubber. A second attaching member 117 may be provided in the second recess region 116. The second attaching member 117 may attach the wafer 120 to the upper chuck 115. Alternatively, the second attaching member 117 may provide frictional force between the wafer 120 and the upper chuck 115. That is, the wafer 120 and the upper chuck 115 may rotate together as a result of the second attaching member 117. The second attaching member 117 may be formed of the same material as the first attaching member 113.

The dividing method according to example embodiments of the inventive concepts may be used for processing a liquid crystal display panel, an organic light emitting diode panel, and the like.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A wafer dividing method comprising:
   providing a chuck unit having upper and lower chucks;
   loading a wafer between the lower and upper chucks;
   cutting the wafer from an edge thereof by inserting a cutting wire in a space between the lower and upper chucks; and
   supplying an etchant to a groove of the wafer, the groove being formed by the cutting wire, wherein the upper chuck covers an upper sidewall of the wafer and the lower chuck covers a lower sidewall of the wafer.

2. The wafer dividing method of claim 1, wherein a space between the lower and upper chucks is greater than a diameter of the cutting wire by approximately 10-20 µm.

3. The wafer dividing method of claim 1, further comprising:
   removing pollutants generated by the cutting wire by injecting nitrogen.

4. The wafer dividing method of claim 1, further comprising:
   supplying the etchant while maintaining the wafer at a temperature of approximately 50-100° C.

5. The wafer dividing method of claim 1, further comprising:
   supplying deionized water to a portion of the wafer to which the etchant is supplied.

6. The wafer dividing method of claim 1, further comprising:
   driving the cutting wire by a driving unit; and
   varying a driving direction of the cutting wire.

7. The wafer dividing method of claim 6, further comprising:
   cutting the wafer while reciprocating the cutting wire.

8. The wafer dividing method of claim 1, wherein cutting the wafer includes at least one of supplying a slurry containing grinding powder and cutting oil to the cutting wire, and using a cutting wire to which a grinding material is attached.

9. The wafer dividing method of claim 1, wherein the cutting wire is under a tension of about 10-50N while dividing the wafer.

10. The wafer dividing method of claim 6, wherein the varying is at irregular intervals.

11. The wafer dividing method of claim 6, wherein the varying is at regular intervals.

12. The wafer dividing method of claim 1, further comprising:
   coating a surface of the cutting wire with a metal alloy including at least one of copper and nickel.

13. The wafer dividing method of claim 1, wherein the upper chuck includes a first recess region and the lower chuck includes a second recess region, the first recess region and the second recess region configured to face each other.

14. The wafer dividing method of claim 1, the chuck unit further comprising:
   a first attaching member in the first recess region; and
   a second attaching member in the second recess region.

15. The wafer dividing method of claim 1, further comprising:
   rotating the upper and lower chucks while cutting the wafer.

16. A wafer dividing method comprising:
   providing a chuck unit having upper and lower chucks;
   loading a wafer between the lower and upper chucks;
   cutting the wafer from an edge thereof by inserting a cutting wire in a space between the lower and upper chucks;
   supplying an etchant to a groove of the wafer, the groove being formed by the cutting wire; and
   maintaining the wafer at a temperature between 50 and 100° C.

* * * * *